(12) United States Patent
Wang et al.

(10) Patent No.: US 12,194,917 B2
(45) Date of Patent: Jan. 14, 2025

(54) LIGHT-EMITTING DEVICE

(71) Applicant: Lite-On Technology Corporation, Taipei (TW)

(72) Inventors: Cheng-Han Wang, Taipei (TW); Cheng-Hong Su, Taipei (TW); Chih-Li Yu, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 409 days.

(21) Appl. No.: 17/579,606

(22) Filed: Jan. 20, 2022

(65) Prior Publication Data

US 2022/0246795 A1     Aug. 4, 2022

Related U.S. Application Data

(60) Provisional application No. 63/144,962, filed on Feb. 2, 2021.

(30) Foreign Application Priority Data

Nov. 25, 2021    (CN) ......................... 202122919148.3

(51) Int. Cl.
*H01L 25/13*      (2006.01)
*B60Q 1/26*       (2006.01)
(Continued)

(52) U.S. Cl.
CPC .............. *B60Q 1/30* (2013.01); *B60Q 1/2607* (2013.01); *B60Q 1/44* (2013.01); *F21S 43/14* (2018.01);
(Continued)

(58) Field of Classification Search
CPC .......... B60Q 1/30; B60Q 1/2607; B60Q 1/44; F21S 43/14; F21S 43/255; F21V 9/30; F21V 9/32; H01L 25/13; H01L 33/10; H01L 33/382; H01L 33/56; H01L 33/62; H01L 33/54; H01L 33/502; H01L 33/505; H01L 33/60; F21Y 2115/10
See application file for complete search history.

(56) References Cited

U.S. PATENT DOCUMENTS

2009/0159915 A1*   6/2009   Branchevsky ........ H01L 33/505
                                                                                257/E33.061
2018/0123001 A1*   5/2018   Hung ..................... H01L 33/60

FOREIGN PATENT DOCUMENTS

CA           2555893 A1 * 11/2007  ............. H01J 61/35
CN       102893417 A  *   1/2013  ............. B29C 45/14
(Continued)

*Primary Examiner* — Mohammed Shamsuzzaman
(74) *Attorney, Agent, or Firm* — JCIPRNET

(57) ABSTRACT

A light-emitting device is provided. The light-emitting device includes a light-emitting diode, a reflective structure, and a package structure. The reflective structure includes a bottom surface and a lateral part. The light-emitting diode is disposed on the bottom surface. The lateral part is disposed surrounding the bottom surface and disposed on the bottom surface. The package structure is configured to package the light-emitting diode and the reflective structure. The package structure includes a first package part and a second package part. The first package part has a phosphorescent powder. An interface is between the first package part and the second package part. The interface is disposed below a top surface of the lateral part.

7 Claims, 4 Drawing Sheets

(51) Int. Cl.
*B60Q 1/30* (2006.01)
*B60Q 1/44* (2006.01)
*F21S 43/14* (2018.01)
*F21S 43/20* (2018.01)
*F21V 9/30* (2018.01)
*H01L 33/10* (2010.01)
*H01L 33/38* (2010.01)
*H01L 33/56* (2010.01)
*H01L 33/62* (2010.01)
*F21Y 115/10* (2016.01)

(52) U.S. Cl.
CPC .............. *F21S 43/255* (2018.01); *F21V 9/30* (2018.02); *H01L 25/13* (2013.01); *H01L 33/10* (2013.01); *H01L 33/382* (2013.01); *H01L 33/56* (2013.01); *H01L 33/62* (2013.01); *F21Y 2115/10* (2016.08)

(56) References Cited

FOREIGN PATENT DOCUMENTS

| | | | | |
|---|---|---|---|---|
| CN | 103682057 A | * | 3/2014 | ............... F21V 5/046 |
| CN | 103782658 A | * | 5/2014 | ............... H01L 51/50 |
| CN | 102220129 B | * | 3/2015 | ........... C09K 11/0883 |
| CN | 113629100 A | * | 11/2021 | ......... H01L 25/0753 |
| CN | 115188875 A | * | 10/2022 | ............... H01L 33/50 |
| JP | 2002042731 A | * | 2/2002 | ............... H01J 61/025 |
| JP | 2013123057 A | * | 6/2013 | ............... H01L 33/04 |
| TW | 200911011 A | * | 3/2009 | ............... C03C 17/36 |
| TW | 200950132 A | * | 12/2009 | |
| TW | 201027808 A | * | 7/2010 | ............... H05B 33/10 |
| TW | 201624776 A | * | 7/2016 | |
| TW | M591709 U | * | 3/2020 | ............... H01L 33/48 |
| WO | WO-2010001992 A1 | * | 1/2010 | ......... C08G 59/1433 |
| WO | WO-2014146029 A1 | * | 9/2014 | ............... A61N 2/002 |
| WO | WO-2016000459 A1 | * | 1/2016 | ............... H01L 33/48 |

* cited by examiner

LIGHT-EMITTING DEVICE

CROSS-REFERENCE TO RELATED APPLICATION

This application claims the priority benefit of U.S. provisional application Ser. No. 63/144,962, filed on Feb. 2, 2021, and China application serial no. 202122919148.3, filed on Nov. 25, 2021. The entirety of the above-mentioned patent application is hereby incorporated by reference herein and made a part of this specification.

BACKGROUND

Technical Field

The disclosure relates to a light-emitting device.

Description of Related Art

Due to the properties of long service life and low power consumption, a light-emitting diode is widely used in daily life, for example, lighting lamps, road signs, emergency escape signs, advertising billboards, atmosphere lights, and toys. Phosphorescent powder may be added to a package structure of the light-emitting diode, so that light emission is maintained for a certain period of time when the power of the light-emitting diode is turned off. However, phosphorescent powder added at an inappropriate location reduces the maximum brightness of the light-emitting diode when the power is turned on.

SUMMARY

The disclosure provides a light-emitting diode, in which phosphorescent powder added, a location where the phosphorescent powder is added is optimized, and a maximum brightness when the power is turned on and the time of maintaining light emission after the power is turned off are optimized.

According to an embodiment of the disclosure, a light-emitting device is provided. The light-emitting device includes a light-emitting diode, a reflective structure, and a package structure. The reflective structure includes a bottom surface and a lateral part. The light-emitting diode is disposed on the bottom surface. The lateral part is disposed surrounding the bottom surface and disposed on the bottom surface. The package structure is configured to package the light-emitting diode and the reflective structure. The package structure includes a first package part and a second package part. The first package part has a phosphorescent powder. An interface is between the first package part and the second package part. The interface is disposed below a top surface of the lateral part.

According to an embodiment of the disclosure, the interface is disposed between the top surface of the lateral part and the bottom surface.

According to an embodiment of the disclosure, the light-emitting diode is packaged in the second package part.

According to an embodiment of the disclosure, the second package part does not have a phosphorescent powder.

According to an embodiment of the disclosure, the light-emitting device further includes a phosphor powder layer. The phosphor powder layer is filled in the reflective structure and covers the light-emitting diode.

According to an embodiment of the disclosure, the second package part includes a recessed structure.

According to the disclosure and embodiment, the recessed structure has a function of total reflection.

According to an embodiment of the disclosure, the light-emitting device further includes a pair of conductive electrodes. The pair of conductive electrodes is electrically connected to the light-emitting diode. The reflective structure is a part of one of the pair of conductive electrodes.

According to an embodiment of the disclosure, the pair of conductive electrodes are packaged in the first package part.

According to an embodiment of the disclosure, the light-emitting device further includes an adhesive layer. The adhesive layer is disposed between the light-emitting diode and the bottom surface of the reflective structure.

According to disclosure and embodiments, a light-emitting device is provided. The light-emitting device includes a light-emitting diode and a package structure. The package structure is configured to package the light-emitting diode. The package structure includes a first package part and a second package part. The first package part has a phosphorescent powder. The second package part does not have a phosphorescent powder. The light-emitting diode is packaged in the second package part.

According to an embodiment of the disclosure, the light-emitting device further includes a pair of conductive electrodes. The pair of conductive electrodes is electrically connected to the light-emitting diode. The light-emitting diode is disposed on a top surface of one of the pair of conductive electrodes. The pair of conductive electrodes are packaged in the first package part.

Based on the foregoing, in the light-emitting device provided in the embodiments of the disclosure, the first package part is disposed at a location below the top surface of the reflective structure, preventing light emitted by the light-emitting diode from being attenuated because of particles of phosphorescent powder when the power of the light-emitting diode is turned on. In an embodiment, the top surface of the reflective structure is also aligned with the interface between the first package part and the second package part, maximizing the ratio of the first package part to the second package part, so as to maximize the time of maintaining light emission after the power of the light-emitting device is turned off.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
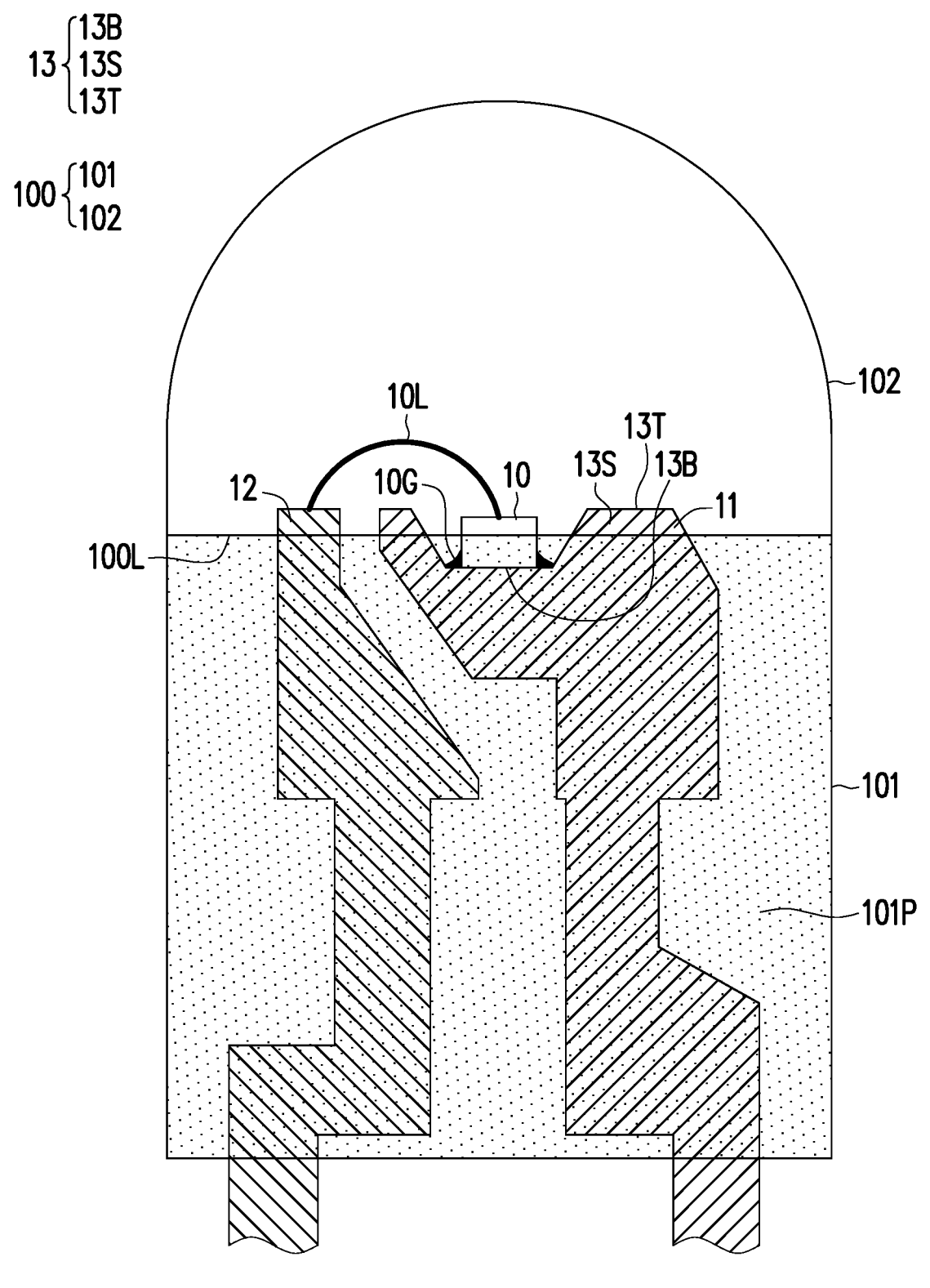
FIG. 1 shows a perspective view of a light-emitting device according to an embodiment of the disclosure.

Reference will now be made in detail to the embodiments of the disclosure, which are shown in the accompanying drawings. Wherever possible, the same reference numerals are used in the drawings and the description herein to refer to the same or similar parts.

With reference to FIG. 1, FIG. 1 shows a perspective view of a light-emitting device according to an embodiment of the disclosure. A light-emitting device 1 includes a light-emitting diode 10, a reflective structure 13, and a package structure 100. The reflective structure 13 is a bowl-shaped structure and includes a bottom surface 13B, a lateral part 13S, and a top surface 13T of the lateral part 13S. The light-emitting diode 10 is disposed on the bottom surface 13B. The lateral part 13S is disposed surrounding the bottom surface 13B and is disposed on the bottom surface 13B.

The package structure 100 is configured to package the light-emitting diode 10 and the reflective structure 13. The package structure 100 includes a first package part 101 and a second package part 102. The second package part 102 is disposed on the first package part 101. The first package part 101 includes a phosphorescent powder 101P. The second package part 102 does not include the phosphorescent powder 101P. The phosphorescent powder 101P is disposed for absorbing light emitted by the light-emitting diode 10 or the ambient light, so that light may be emitted through the phosphorescent powder 101P when the power of the light-emitting device 1 is turned off or the ambient light source disappears, allowing light emission by the light-emitting device 1 to be maintained for a certain period of time. An interface 100L is between the first package part 101 and the second package part 102. In this embodiment, the interface 100L is a straight line in the perspective view shown in FIG. 1. Nonetheless, the disclosure is not limited thereto. In other embodiments, the interface 100L in the perspective view shown in FIG. 1 may be one of an arc line, a segmented line, and various types of curves.

It should be noted that, in the embodiments of the disclosure, the interface 100L between the first package part 101 and the second package part 102 does not exceed the top surface 13T of the lateral part 13S. Specifically, as shown in FIG. 1, the interface 100L is disposed at a position lower than the top surface 13T of the lateral part 13S. Under this case, light beams emitted from the light-emitting diode 10 and reflected on the lateral part 13S of the reflective structure 13 can be transmitted out of the light-emitting device 1 from the second package part 102 that is not added with the phosphorescent powder 101P, instead of being transmitted out of the light-emitting device 1 through the first package part 101 added with the phosphorescent powder 101P, preventing the light beams emitted by the light-emitting diode 10 from being absorbed by the phosphorescent powder 101P, which reduces the maximum brightness of the light-emitting diode 10 when the power is turned on, and also affects the color of the emitted light of the light-emitting device 1. In an embodiment of the disclosure, from the cross section view, the interface 100L is a straight line and is aligned with (corresponding to) the top surface 13T of the lateral part 13S. In other words, both the interface 100L and the top surface 13T of the lateral part 13S are present in a horizontal cross section of the light-emitting device 1, not only preventing the light beams emitted by the light-emitting diode 10 from being absorbed by the phosphorescent powder 101P, but also maximizing the ratio of the first package part 101 to the second package part 102 (maximizing the first package part 101 added with the phosphorescent powder 101P), so as to maximize the time of maintaining light emission through the phosphorescent powder 101P after the power of the light-emitting device 1 is turned off.

Nonetheless, the disclosure is not limited thereto. In some embodiments of the disclosure, the interface 100L is disposed below the top surface 13T of the reflective structure 13 in the perspective view shown in FIG. 1, and may be lower than the bottom surface 13B of the reflective structure 13. However, preferably, the interface 100L is disposed between the bottom surface 13B and the top surface 13T of the reflective structure 13. Under this case, the bottom surface 13B of the reflective structure 13 corresponds to the first package part 101 as shown in FIG. 1, and the top surface 13T of the reflective structure 13 corresponds to the second package part 102. Under this case, the light-emitting device 1 has a sufficient phosphorescent section and can provide a better phosphorescence effect. In some embodiments of the disclosure, the interface 100L is aligned with the bottom surface 13B of the reflective structure 13 in the perspective view shown in FIG. 1.

In this embodiment, the package structure 100 includes epoxy resin. The concentration of the added phosphorescent powder 101P of the first package part 101 falls within a range of 5% to 70% to increase the process yield and phosphorescence efficiency. Specifically, since the first package part 101 includes the phosphorescent powder 101P and the second package part 102 does not include the phosphorescent powder 101P, it may be difficult to bond the first package part 101 and the second package part 102 because of their different material components. When the concentration of the added phosphorescent powder 101P of the first package part 101 falls within a range of 38% to 42%, the process yield of bonding the first package part 101 and the second package part 102 can be increased, and the first package part 101 can provide a good light-emitting effect through the phosphorescent powder 101P. In another embodiment of the disclosure, the concentration of the added phosphorescent powder 101P of the first package part 101 falls within the range of 38% to 42%. In still another embodiment of the disclosure, the concentration of the added phosphorescent powder 101P of the first package part 101 is approximately 40%.

In the embodiment shown in FIG. 1, the light-emitting device 1 also includes a first conductive electrode 11 and a second conductive electrode 12. The first conductive electrode 11 and the second conductive electrode 12 are electrically connected to the light-emitting diode 10. In addition, the reflective structure 13 is a part of the first conductive electrode 11. Specifically, the light-emitting device 1 also includes an adhesive layer 10G disposed between the light-emitting diode 10 and the bottom surface 13B of the reflective structure 13. Specifically, in the implementation of a vertical-type chip shown in FIG. 1, the adhesive layer 10G is a conductive adhesive layer and includes metal powder. The light-emitting diode 10 disposed on the bottom surface 13B of the reflective structure 13 is electrically connected to the first conductive electrode 11 through the adhesive layer 10G, and is electrically connected to the second conductive electrode 12 through a wire 10L. Nonetheless, in other implementations where a horizontal-type chip is used, the adhesive layer 10G may also be non-conductive. In addition, the first conductive electrode 11 and the second conductive electrode 12 are packaged in the first package part 101. To fully describe various implementations of the disclosure, other embodiments of the disclosure will be described hereinafter. It should be noted here that the reference numerals and part of the content of the above embodiment remain to be used in the following embodiments, where the same reference numerals are used to denote the same or similar elements, and the description of the same technical content is omitted. Reference may be made to the above embodiment for the description of the omitted part, which will not be repeated in the following embodiments.

Figure 2:
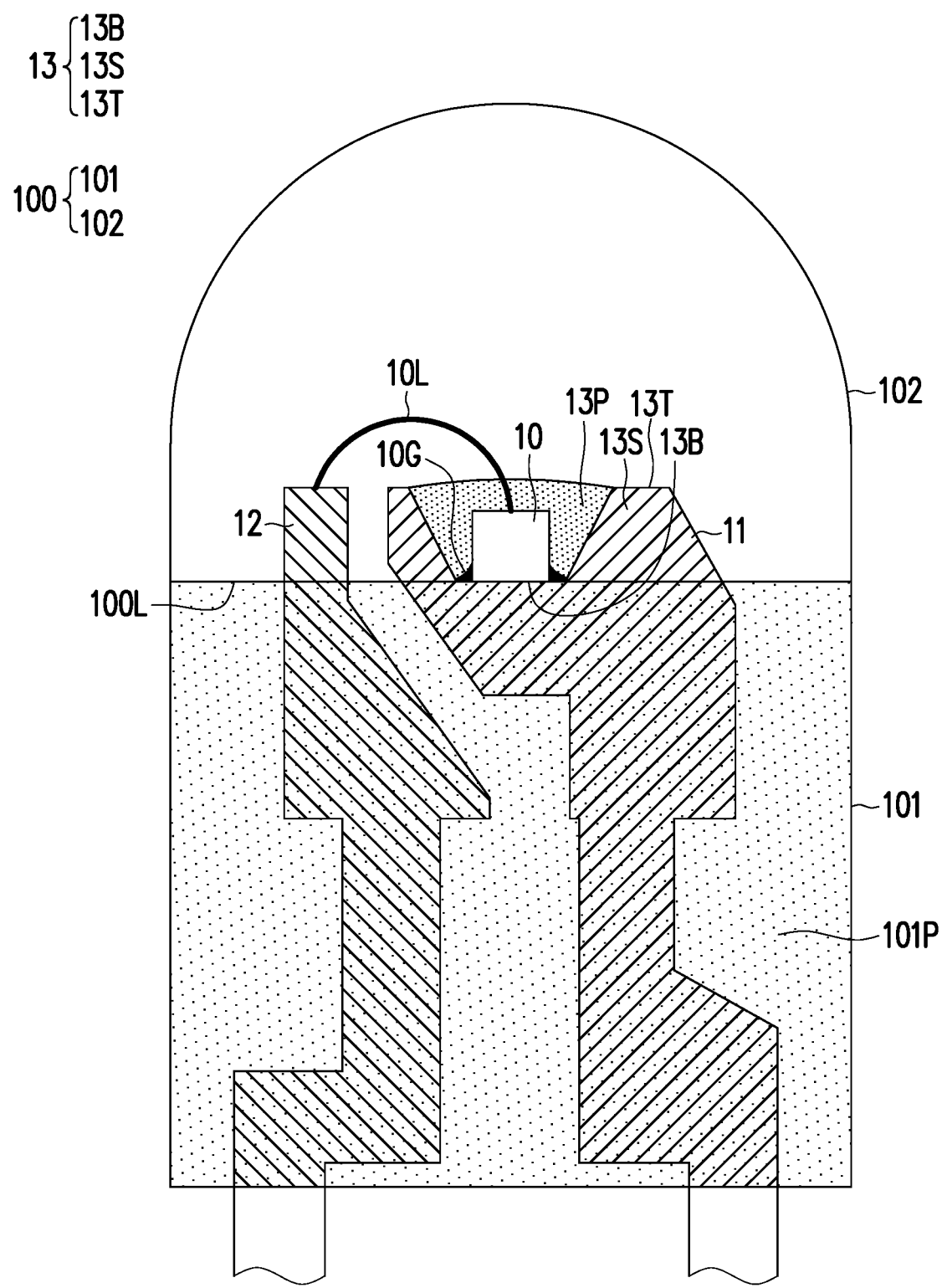
FIG. 2 shows a perspective view of a light-emitting device according to an embodiment of the disclosure.

With reference to FIG. 2, FIG. 2 shows a perspective view of a light-emitting device according to an embodiment of the disclosure. A light-emitting device 2 is similar to the light-emitting device 1 in that the light-emitting device 2 also includes the light-emitting diode 10, the reflective structure 13, and the package structure 100. The light-emitting device 2 is different from the light-emitting device 1 in that the interface 100L between the first package part 101 and the second package part 102 is aligned with the bottom surface 13B of the reflective structure 13 in the perspective view shown in FIG. 2, and the light-emitting diode 10 is packaged in the second package part 102. In addition, the light-emitting device 2 also includes a phosphor powder layer 13P. The phosphor powder layer 13P is disposed in the reflective structure 13 and covers the light-emitting diode 10. In other words, the light-emitting diode 10 is disposed between the bottom surface 13B of the reflective structure 13 and the phosphor powder layer 13P. The light-emitting diode 10 may emit light of a shorter wavelength, such as ultraviolet light or blue light, to excite the phosphor powder layer 13P to emit light of a longer wavelength, such as green light, yellow light, or red light. When the light emitted by the light-emitting diode 10 excites the phosphor powder layer 13P, part of the light generated by the phosphor powder layer 13P is directly emitted upward out of the phosphor powder layer 13P, and other parts of the light generated by the phosphor powder layer 13P is reflected on the lateral part 13S of the reflective structure 13 to be emitted upward out of the phosphor powder layer 13P, and then emitted out of the light-emitting device 2 from a top surface or a side surface of the light-emitting device 2.

Figure 3:
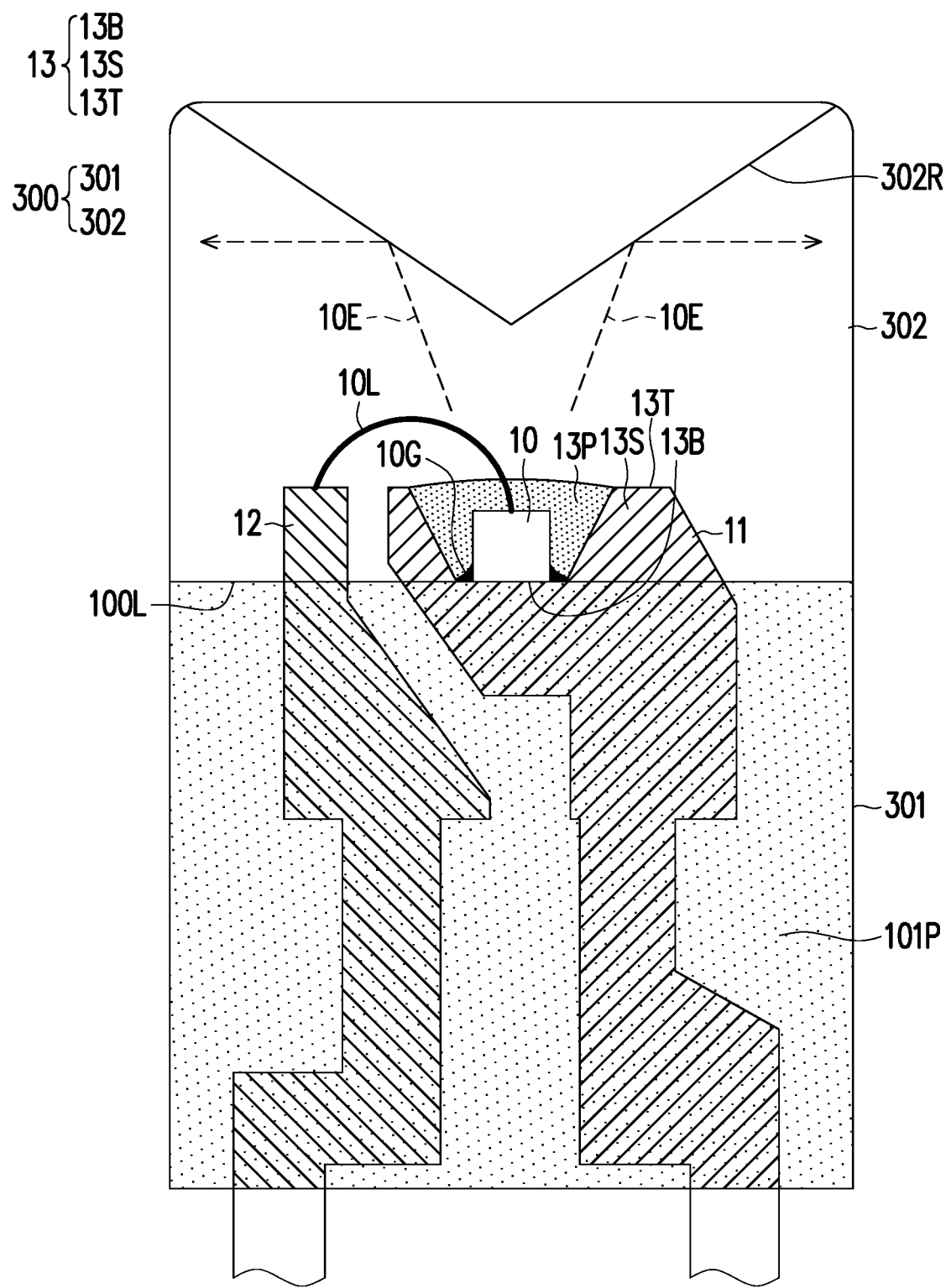
FIG. 3 shows a s perspective view of a light-emitting device according to an embodiment of the disclosure.

With reference to FIG. 3, FIG. 3 shows a perspective view of a light-emitting device according to an embodiment of the disclosure. A light-emitting device 3 includes the light-emitting diode 10, the reflective structure 13, the phosphor powder layer 13P, and a package structure 300. The package structure 300 includes a first package part 301 and a second package part 302. The second package part 302 includes a recessed structure 302R. In this embodiment, the center of the recessed structure 302R corresponds to the geometric center of the light-emitting diode 10 that emits light 10E and the geometric center of the reflective structure 13, and the above three geometric centers locate on a same straight line. The recessed structure 302R has total reflection effects, and its side surface can totally reflect part of the light 10E emitted by the light-emitting diode 10 to be emitted out of the light-emitting device 3 from a side surface out of the light-emitting device 3, increasing the intensity of the lateral light (laterally emitted light).

Figure 4:
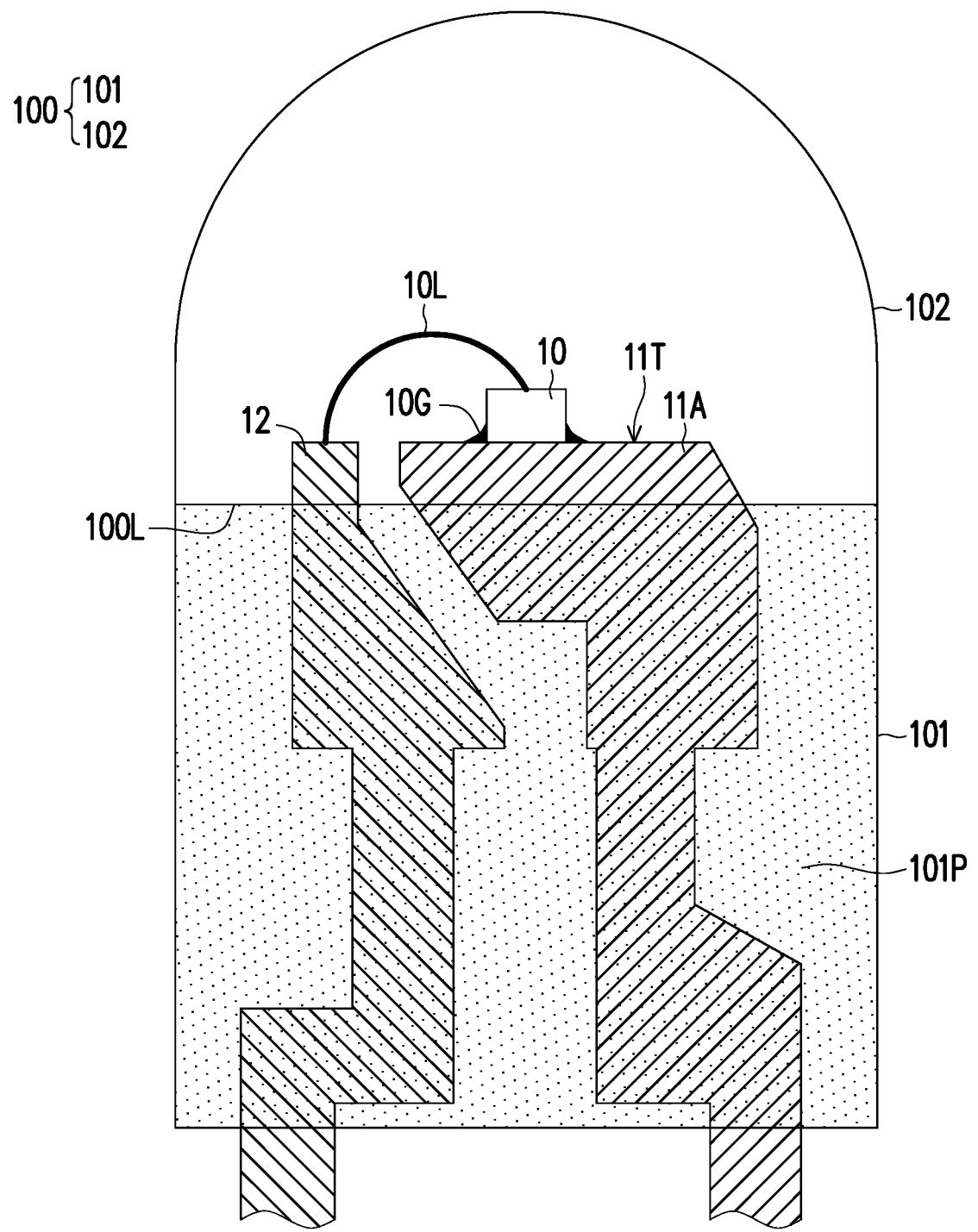
FIG. 4 shows a perspective view of a light-emitting device according to an embodiment of the disclosure.

With reference to FIG. 4, FIG. 4 shows a perspective view of a light-emitting device according to an embodiment of the disclosure. A light-emitting device 4 includes the light-emitting diode 10 and the package structure 100. The package structure 100 includes the first package part 101 and the second package part 102. The first package part 101 has the phosphorescent powder 101P. The second package part 102 does not have the phosphorescent powder 101P. The interface 100L is between the first package part 101 and the second package part 102.

The light-emitting device 4 also includes a first conductive electrode 11A and the second conductive electrode 12. The light-emitting diode 10 is disposed on a top surface 11T of the first conductive electrode 11A, and is electrically connected to the second conductive electrode 12 through the wire 10L.

In this embodiment, the interface 100L between the first package part 101 and the second package part 102 is lower than the light-emitting diode 10. In other words, the interface 100L is lower than the top surface 11T where the light-emitting diode 10 is disposed, preventing the light beams emitted by the light-emitting diode 10 from being attenuated because of particles of the phosphorescent powder 101P when the power is turned on. In an embodiment, the interface 100L is aligned with the top surface 11T of the first conductive electrode 11A, maximizing the ratio of the first package part 101 to the second package part 102, so as to maximize the time of maintaining light emission by the light-emitting device 4 after the power is turned off.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A light-emitting device, comprising:
    a light-emitting diode;
    a pair of conductive electrodes electrically connected to the light-emitting diode, one of the pair of conductive electrodes having a reflective structure, wherein the reflective structure comprising a bottom surface and a lateral part, wherein the light-emitting diode is disposed on the bottom surface, and the lateral part is disposed surrounding the bottom surface and disposed on the bottom surface and a phosphor powder layer filled in the reflective structure covering the light-emitting diode; and
    a package structure configured to package the light-emitting diode and the reflective structure, wherein the package structure comprises a first package part and a second package part, the first package part has a phosphorescent powder, and an interface is between the first package part and the second package part,
    wherein the interface is disposed below a top surface of the lateral part, aligned with the bottom surface of the reflective structure, and the first package part having the phosphorescent powder surrounds the reflective structure and the pair of conductive electrodes are packaged in the second package part.

2. The light-emitting device according to claim 1, wherein the light-emitting diode is packaged in the second package part.

3. The light-emitting device according to claim 1, wherein the second package part does not have a phosphorescent powder.

4. The light-emitting device according to claim 1, wherein the second package part comprises a recessed structure.

5. The light-emitting device according to claim 4, wherein the recessed structure has a function of total reflection.

6. The light-emitting device according to claim 1, further comprising an adhesive layer disposed between the light-emitting diode and the bottom surface of the reflective structure.

7. A light-emitting device, comprising:
    a light-emitting diode;
    a pair of conductive electrodes electrically connected to the light-emitting diode, and a package structure configured to package the light-emitting diode, wherein the package structure comprises a first package part and a second package part, an interface between the first package part and the second package part aligned with a bottom surface of the light-emitting diode, the first package part has a phosphorescent powder, and the second package part does not have a phosphorescent powder, wherein the light-emitting diode is packaged in the second package part and a phosphor powder layer covering the light-emitting diode, and the first package part having the phosphorescent powder surrounds the pair of conductive electrodes and the pair of conductive electrodes are packaged in the second package part.

\* \* \* \* \*